(12) United States Patent
Ramzan et al.

(10) Patent No.: US 10,186,743 B2
(45) Date of Patent: Jan. 22, 2019

(54) MICROSTRIP CIRCUITS EXHIBITING ELECTROMAGNETICALLY INDUCED TRANSPARENCY AND FANO RESONANCE

(71) Applicant: UNITED ARAB EMIRATES UNIVERSITY, Al-Ain (AE)

(72) Inventors: Rashad Ramzan, Al-Ain (AE); Muhammad Amin, Madinah (SA); Omar Farooq Siddiqui, Madinah (SA); Nabil Bastaki, Al-Ain (AE)

(73) Assignee: United Arab Emirates University, Al-Ain (AE)

( * ) Notice: Subject to any disclaimer, the term of this patent is extended or adjusted under 35 U.S.C. 154(b) by 167 days.

(21) Appl. No.: 15/420,061

(22) Filed: Jan. 30, 2017

(65) Prior Publication Data
US 2018/0219531 A1    Aug. 2, 2018

(51) Int. Cl.
| | |
|---|---|
| H01P 1/203 | (2006.01) |
| H01P 3/08 | (2006.01) |
| H01P 7/08 | (2006.01) |
| H03H 11/02 | (2006.01) |
| H03H 11/16 | (2006.01) |

(52) U.S. Cl.
CPC ............... *H01P 1/203* (2013.01); *H01P 3/08* (2013.01); *H01P 7/08* (2013.01); *H01P 7/082* (2013.01); *H03H 11/02* (2013.01); *H03H 11/16* (2013.01)

(58) Field of Classification Search
CPC .. H01P 1/203; H01P 3/08; H01P 3/081; H01P 3/084; H01P 3/087; H01P 7/08; H01P 7/082
USPC .......................................... 333/204, 205, 246
See application file for complete search history.

(56) References Cited

U.S. PATENT DOCUMENTS

| | | | |
|---|---|---|---|
| 2010/0295701 A1 | 11/2010 | Denis et al. | |
| 2011/0019259 A1 | 1/2011 | Yen et al. | |
| 2012/0169436 A1* | 7/2012 | Nusair | H01P 1/2039 333/204 |

OTHER PUBLICATIONS

Mirzaei, "Negative-group-delay and non-foster electromagnetic structures,"—Thesis, University of Toronto, © 2015, Chapter 4, Fig. 4.4, p. 46.

* cited by examiner

*Primary Examiner* — Rakesh Patel
(74) *Attorney, Agent, or Firm* — Richard C. Litman

(57) ABSTRACT

The microstrip circuits exhibiting electromagnetically induced transparency and Fano resonance include a microstrip transmission line and at least two identical parallel quarter-wavelength open stubs extending from the transmission line in close proximity so that mutual coupling between the electromagnetic fields at adjacent ends of the stubs induces Faro resonances and electromagnetically induced transparency (EIT). The circuits may be used for microwave buffers, or when a variable capacitance, such as a varactor, is inserted between the open ends of the stubs, the circuits may be used for active transmission phase control.

18 Claims, 9 Drawing Sheets

MICROSTRIP CIRCUITS EXHIBITING ELECTROMAGNETICALLY INDUCED TRANSPARENCY AND FANO RESONANCE

BACKGROUND OF THE INVENTION

1. Field of the Invention

The present invention relates to microstrip transmission line structures, and particularly to microstrip circuits exhibiting electromagnetically induced transparency and Fano resonance.

2. Description of the Related Art

Resonance is a universal phenomenon that deals with the ability of the system to oscillate with greater amplitude at certain frequencies within a spectrum. The spectral line shape of a typical oscillator is originally explained by the symmetrical Lorentzian function, which is considered to be the default spectral profile for all kinds of resonances. In 1961, Fano observed the unexpected asymmetric line shape in resonant scattering systems found in quantum mechanics. This unconventional characteristic was described by Fano as a quantum interference of a discrete state with a continuum state leading to an asymmetric spectral profile. It would be desirable to exploit this Fano resonance phenomenon in a classical microwave structure.

Thus, microstrip circuits exhibiting electromagnetically induced transparency and Fano resonance solving the aforementioned problems are desired.

SUMMARY OF THE INVENTION

The microstrip circuits exhibiting electromagnetically induced transparency and Fano resonance include a microstrip transmission line and at least two identical parallel quarter-wavelength open stubs extending from the transmission line in close proximity so that mutual coupling between the electromagnetic fields at adjacent ends of the stubs induce Faro resonances and electromagnetically induced transparency (EIT). The circuits may be used for microwave buffers, or when a variable capacitance, such as a varactor, is inserted between the open ends of the stubs, the circuits may be used for active transmission phase control.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
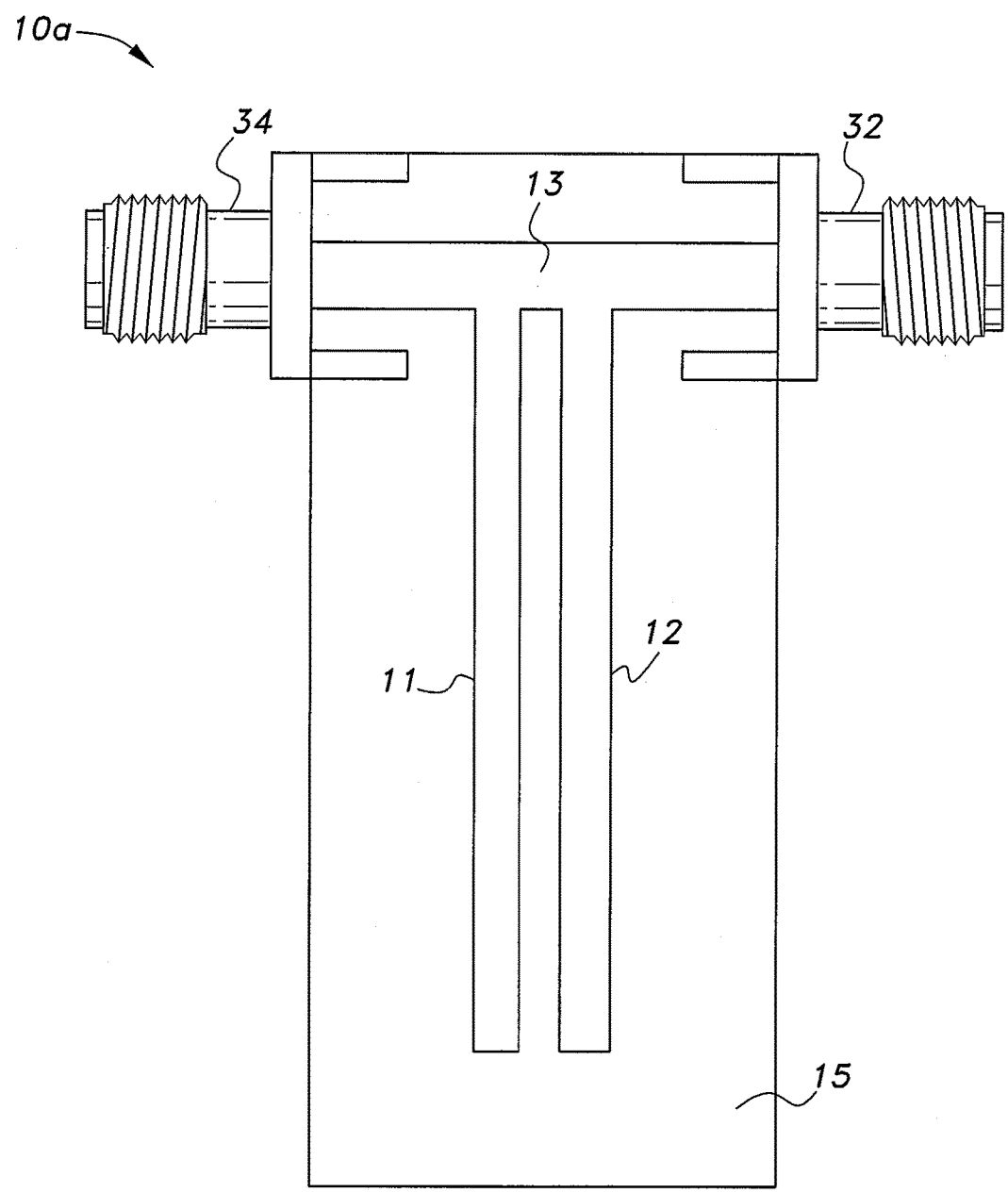
FIG. 1A is a perspective view of a double open-stub embodiment of a microstrip circuit exhibiting electromagnetically induced transparency and Fano resonance according to the present invention.
Figure 1B:
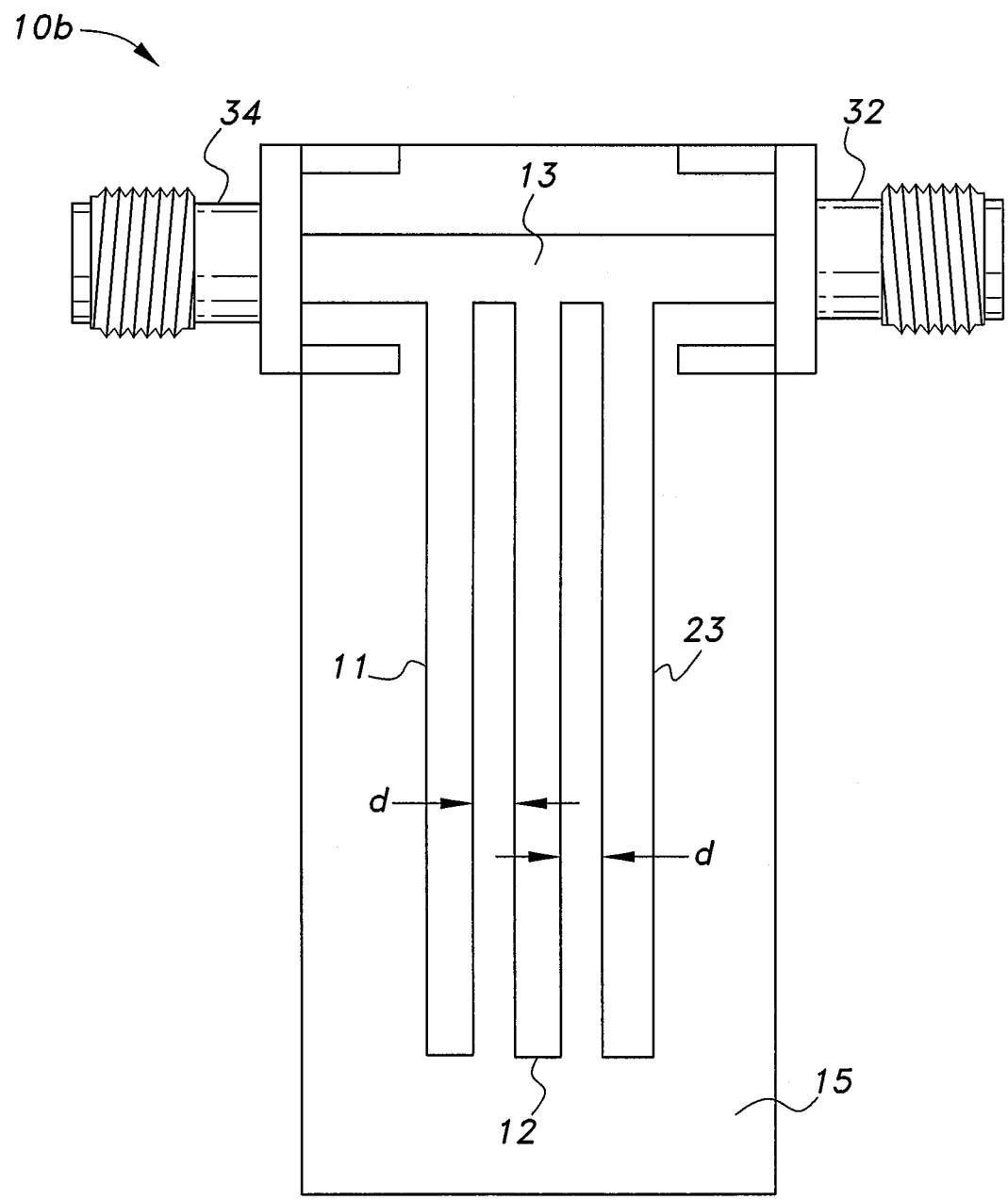
FIG. 1B is a perspective view of a triple open-stub embodiment of a microstrip circuit exhibiting electromagnetically induced transparency and Fano resonance according to the present invention.
Figure 5:
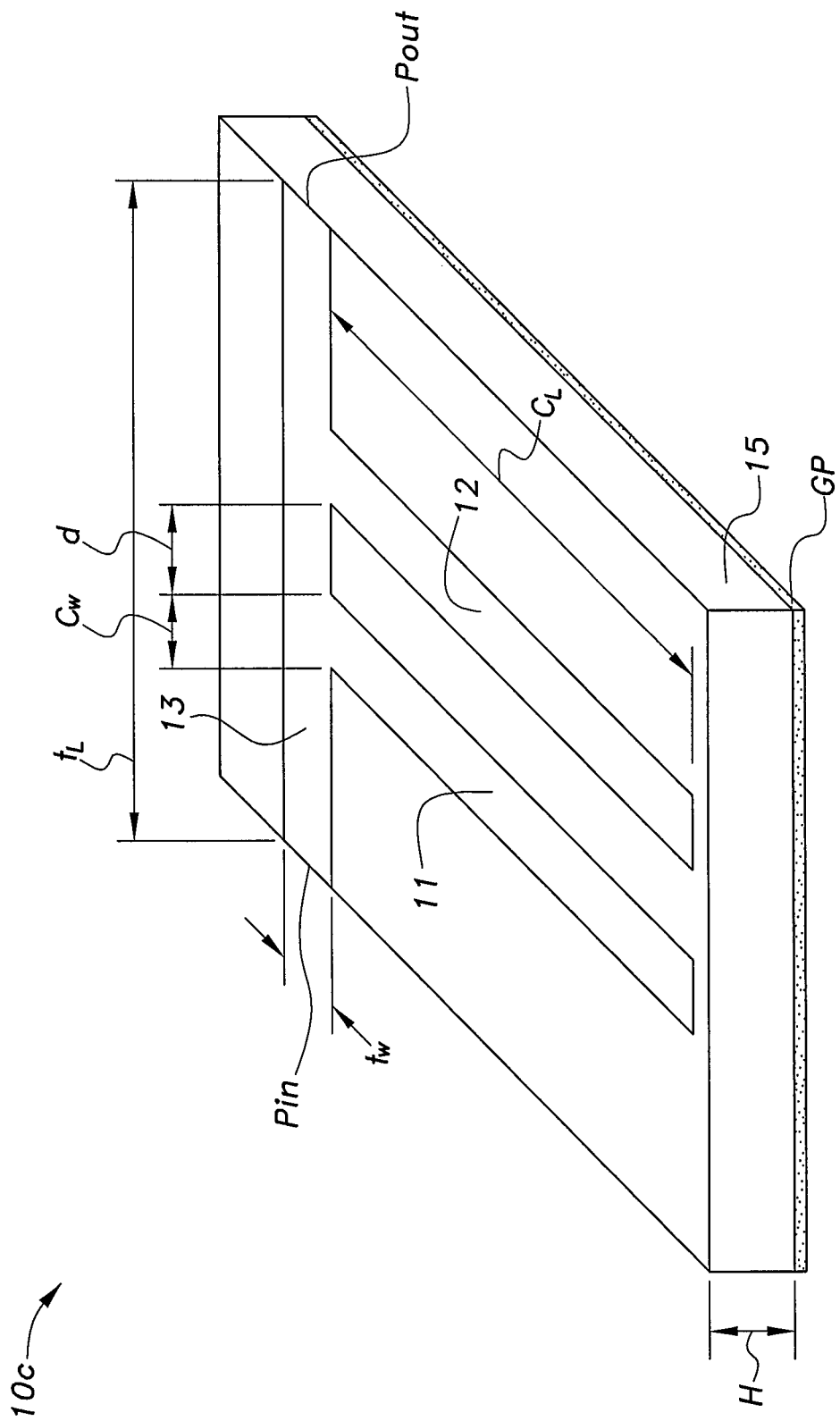
FIG. 5 is a perspective view of the double open-stub embodiment of a microstrip circuit exhibiting electromagnetically induced transparency and Fano resonance according to the present invention.

Referring to FIGS. 1A, 1B, and 5, the microstrip circuits exhibiting electromagnetically induced transparency and Fano resonance are microstrip circuits having at least two stubs formed from parallel elongate planar electrically conducting strip elements, e.g., strip elements 11, 12, or 23, extending from and in perpendicular relationship to an electrically conducting transmission line strip 13, the transmission line strip 13 having an input side $P_{in}$ and an output side $P_{out}$, all strip elements being disposed on an upper side of non-conducting substrate 15 having a permittivity of approximately 2.94 and a thickness H of approximately 0.76 mm, the circuit forming, e.g., Fano resonator 10a, or Fano resonator 10b. The transmission line strip 13 has an exemplary total length, $t_L$=20 mm, and an exemplary width, $t_w$=3.16 mm. The transmission line strip 13 is electrically connected to an input coaxial connector 34 and an output coaxial connector 32. The stubs 11 and 12 are of exemplary width $C_w$=2 mm. Stubs 11 and 12 have open ends that are distal from the conducting transmission line strip 13, the stubs 11, 12, 23 being closely located, substantially identical quarter-wavelength ($\lambda/4$) members that load the conducting transmission line strip 13. Dimensions are most clearly shown in the connectorless structure 10c of FIG. 5. When these identical stubs are connected in proximity, they behave differently from their identical RLC counterparts. The underlying resonance mechanism in the stub configuration stems from the strong mutual coupling that exists between the electric fields generated at the open ends of adjacent stubs. While a single open-circuited stub provides the required background resonance state, by having two identical open stubs, e.g., stub 11 and stub 12 each having exemplary length $C_l$=35 mm, in close proximity separated by an exemplary distance d=2 mm leads to the dual resonance states. Two identical stubs in proximity can be approximated as two slightly detuned resonators, leading to extremely narrowband EIT and Fano resonances.

The resonating elements in the circuits are physically connected to the transmission path, resulting in stronger dispersive effects resulting in higher Q factor EIT windows. Furthermore, since the resonance mixing takes place at the open ends of the stubs 11, 12, 23 away from the transmission line 13, varactors can be conveniently placed without breaking the transmission path for low loss phase-control of EIT applications. By configuring the proposed circuit with multiple open stubs, we show through simulation and experiment that several EIT bands can be obtained through destructive interference of the associated multiple resonances. With the present open-stub circuits, novel slow-light applications can be fabricated in the microwave domain, such as microwave buffers and phase shifters. Since the proposed structures are compact and fully planar, seamless integration is achieved with low profile high frequency electronics.

The spectral line shape of the two-level elementary atomic resonance observed in the classical oscillator model and the quantum theory is represented by the Lorentzian model characterized by the relation:

$$I(\omega) = \frac{\gamma^2}{\gamma^2 + (\omega - \omega_{res})^2} \quad (1)$$

The Fano resonances with asymmetric line shapes are obtained when two or more resonant responses are made to interfere either constructively or destructively, resulting in the following characteristic equation:

$$I(\omega) = \frac{(q\gamma + \omega - \omega_{res})^2}{\gamma^2 + (\omega - \omega_{res})^2} \quad (2)$$

The Fano parameter 'q' determines the degree of asymmetry between the frequency responses on either side of the resonant frequency $\omega_{res}$. From the electric circuit theory view point, a resonance is created in the spectral vicinity of the electric-magnetic energy balance, and hence its line shape can be approximated by the frequency response of an equivalent inductive-capacitive (LC) network. Therefore, with circuit representations, the classical atomic resonances can be replicated in the lower spectra at macroscopic levels, where they can be exploited in more practical microwave and millimeter wave applications. The Lorentzian line shape of Eq. 1 can be approximated by a series RLC resonator connected to a transmission line. A more practical version would be an open circuit quarter-wavelength stub configuration. Mathematically, the transmission response obtained by applying microwave Kirchhoff's current equation to the transmission line and stub combination is characterized by the relation:

$$S_{21} = \frac{2Z_0}{2AZ_0 + A^2 Z_0^2 / B + B - Z_0^2 / B} \quad (3)$$

where Zo is the characteristic impedance of the present microstrip lines. The stub configuration has an added advantage that there is an intensive accumulation of the surface charges at the open end. Therefore, the introduction of the interfering resonance is possible by simply adding slightly displaced stubs of similar dimensions to the existing transmission line. Note that with an additional stub, the consequential geometrical asymmetry and intense electric fields at the open end lead to the redistribution of the inductive-capacitive behavior of the individual stubs, which causes an effective detuning of the frequency response. In other words, the ABCD parameters of Eq. 3 will have to be reassigned to obtain a close form mathematical expression of the interfering phenomenon that results in the higher order resonances. Due to the complexity and rigor involved in this derivation, an exemplary design strategy would be to construct the higher order frequency responses by adjusting the position of the stubs by extensive full-wave simulations followed by the experimental verification of the concept. Moreover, since the resonant detuning is obtained by proximity effect, a slight change in the mutual coupling between the adjacent stubs would result in spectral shift of the higher order resonances.

Figure 2A:
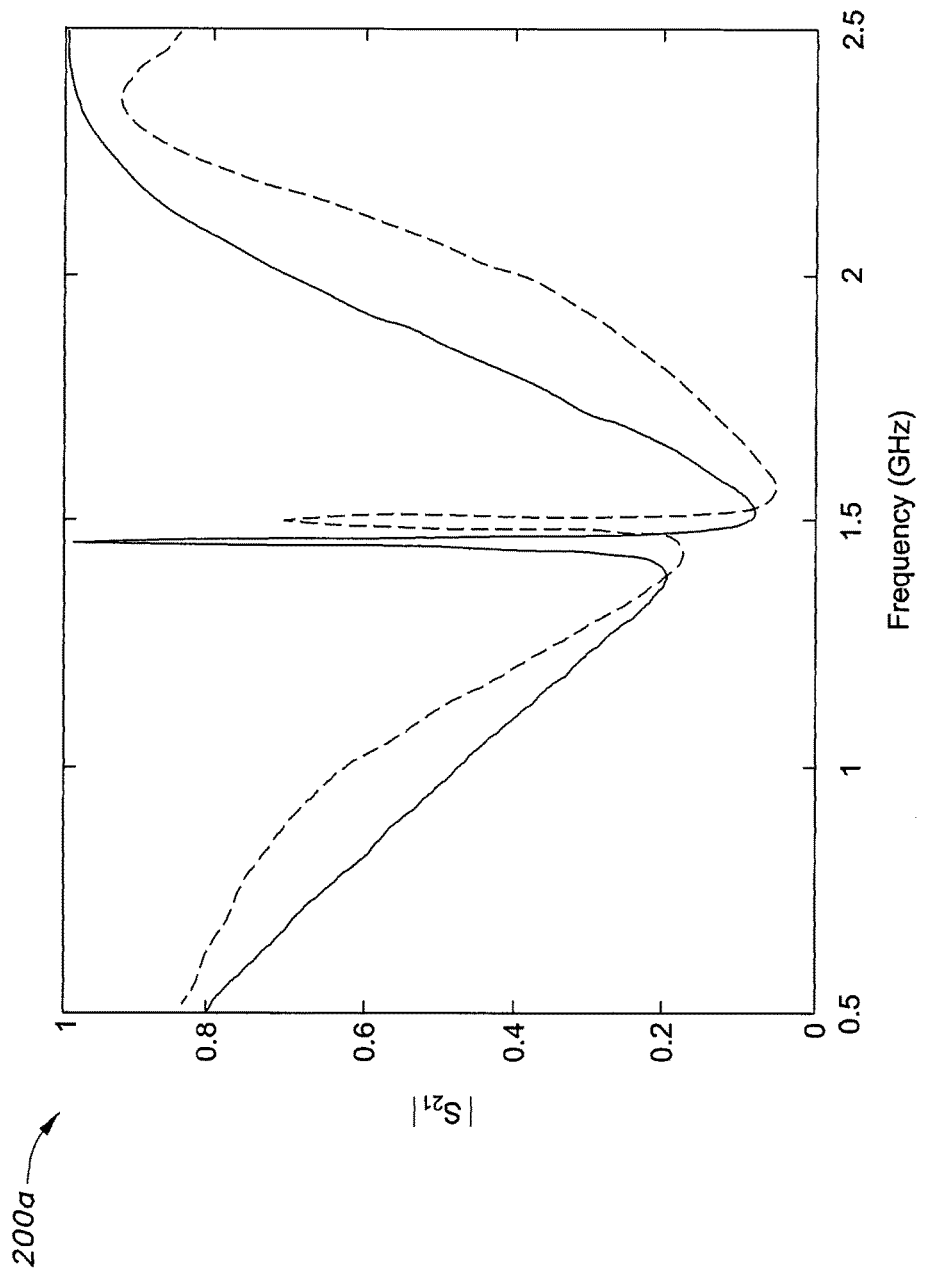
FIG. 2A is a plot showing the transmission $S_{21}$ characteristics of the double open-stub embodiment of FIG. 1A.
Figure 2B:
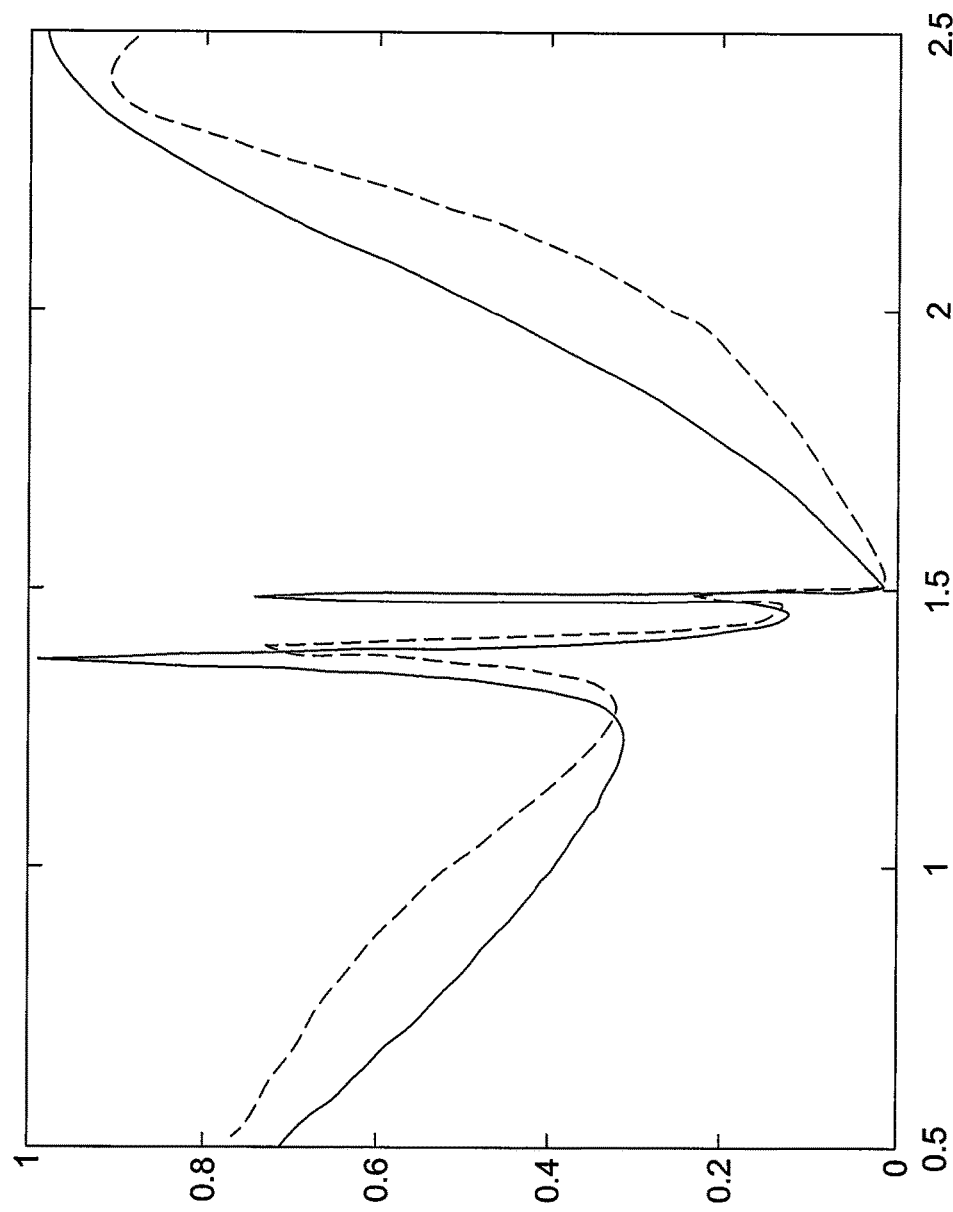
FIG. 2B is a plot showing the transmission $S_{21}$ characteristics of the triple open-stub embodiment of FIG. 1B.

To observe the resonance formations as a result of constructive and destructive interferences in the proposed microstrip structures, full-wave simulations were carried out by employing the finite-element-based electromagnetic simulator COMSOL. The perfect electric conductor (PEC) boundaries were used to model the microstrip lines and the ground plane GP (shown in FIG. 5), the ground plane being disposed on the bottom surface of the substrate. The input and output port elements were modeled as rectangular surfaces between microstrip and ground planes and the incident electric fields were assigned in vertical directions between microstrip and ground plane. The computational domain was terminated by scattering boundary conditions to simulate infinite space surrounding the microstrip circuit. For practical demonstration, the microstrip structures were fabricated on Rogers 6002 substrate (dielectric permittivity 2.94) using MITS AUTOLAB milling machine. The transmission response was measured by a Rohde and Schwarz ZVL13 Vector Network Analyzer. The simulation and experimental results for the $S_{21}$ characteristics of double stubbed embodiment 10a are shown in plot 200a of FIG. 2A. The simulation and experimental results for the $S_{21}$ characteristics of triple stubbed embodiment 10b are shown in plot 200b of FIG. 2B. It has been demonstrated that a single-stub resonator produces Lorentzian amplitude and phase responses.

With the present two identical stub configuration 10a shown in FIG. 1A, two slightly detuned resonances resulting in an EIT window characterized by Fano line shape is achieved. With configuration 10a, a Fano line-shaped resonance is observed, which, in simulation, has a 99% efficient EIT band around 1.455 GHz frequency. There is around a 3 dB loss in experimental results that can be attributed to the fabrication and inherent material losses. The electromagnetic interferences leading to the highly frequency selective resonant response can be explained by considering the steady-state surface charge distribution at various points around the resonance. Below the resonance point (1.404 GHz), the second stub carries intense distribution of negative charge compared to the first stub, which is responsible for the amplitude dip and the subsequent EIT transmission. At EIT resonance frequency, i.e., 1.454 GHz, the two stubs are completely out of phase, leading to a very strong destructive interference between the resonances. Finally, above the resonance frequency, i.e., 1.515 GHz, the charges at the two stubs transition to in-phase, leading to constructive interference and suppression of transmission. A sharp phase jump can be seen across the EIT band, which is expected due to the nature of the narrowband response. The calculated Q-factor in the EIT band is close to 84.

Finally, when a third, slightly displaced stub is added (configuration 10b shown in FIG. 1B), the triple resonance mixing produces multiple Fano line shapes resonances, and as a result, two distinct EIT bands are observed around 1.374 GHz and 1.485 GHz frequencies. It can be noted that the first EIT band is perfectly transparent up to 99%, and second EIT band is 74% efficient. At the first resonance point, i.e., 1.374 GHz, the intensive surface charge distributions on the first and third stubs become out of phase. As a result, complete destructive interference takes place, which is responsible for the first EIT band. Above resonance frequency, i.e., 1.454 GHz, the charge upon the stubs change phase, leading to constructive interference of resonances. Finally, at the second EIT resonance frequency, i.e., 1.485 GHz, the charges at the two stubs become in phase with each other, while the charge remains out of phase at the middle stub. This causes a destructive interference, stimulating the second EIT band. It can be noted that even though the second EIT band is less transparent than the first one, it is characterized by much higher charge distributions on all three stubs. Consequently, highly selective (sharp) phase response with a decent Q-factor of 147 is observed, which can be exploited in highly sensitive sensing applications. To mitigate fabrication losses, the use of precision planar technology (as used in hybrid circuits with conductive materials), low loss and high permittivity substrates, sub-micrometer thickness, and laser milling, the losses related to manufacturing inaccuracies and tolerances can be significantly reduced.

The EIT windows in a multiple-stub spectral response are the consequence of resonance detuning, which results from relative spatial shifts of the open stub locations. Hence, new equivalent circuit parameters can be assigned when a stub is added to the existing configuration. Consider the equivalent circuit model of the three-stub configuration obtained by loading the host transmission line of impedance Z. The transmittance $|S_{21}|^2$ spectra can be fitted with the RLC resonator transmission response to subsequently extract the RLC lumped element values. To calculate the transmission response of the RLC equivalent circuit (Eq. 3), first, the transfer matrices (ABCD matrices) are generated by the serial multiplication of the individual circuit layers for the one, two, and three stub configurations:

$$T_{single} = T_{tl} T_{s1} T_{tl}$$

$$T_{double} = T_{tl} T_{s1} T_{s2} T_{tl}$$

$$T_{triple} = T_{tl} T_{s1} T_{s2} T_{s3} T_{tl} \quad (4)$$

where $T_{tl}$ and $T_{si}$ are the respective transfer matrices of the host transmission line and the single stub, given by:

$$T_i = \begin{matrix} \cos(kd/2) & iZ\sin(kd/2) \\ i\dfrac{\sin(kd/2)}{Z} & \cos(kd/2) \end{matrix} \quad (5)$$

and $$T_i = \begin{matrix} 1 & 0 \\ Y_i & 1 \end{matrix}. \quad (6)$$

Here, k is the propagation constant, d is the length of microstrip transmission line and ($Y_i$) is the single stub admittance, given by $$Y_i = \frac{1}{1/j\omega C_i + j\omega L_i + R_i}. \quad (7)$$

The RLC resonator transmission curves are generated by the nonlinear Levenberg-Marquardt optimization, the parameters being shown in Table 1:

TABLE 1

The Fitted RLC Parameters Generated By The Levenberg-Marquardt Algorithm

| | Single Stub | | |
|---|---|---|---|
| Parameter | $C_1$ | $L_1$ | $R_1$ |
| | 3.33 pF | 3.42 nH | 692 mΩ |
| | Double Stub | | |
| Parameter | $C_1$ | $L_1$ | $R_1$ |
| | 1.72 pF | 6.51 nH | 10 mΩ |
| Parameter | $C_2$ | $L_2$ | $R_2$ |
| | 3.01 pF | 4.41 nH | 0 Ω |
| | Triple Stub | | |
| Parameter | $C_1$ | $L_1$ | $R_1$ |
| | 2.01 pF | 6.16 nH | 0 Ω |
| Parameter | $C_2$ | $L_2$ | $R_2$ |
| | 3.48 pF | 4.28 nH | 0 Ω |
| Parameter | $C_3$ | $L_3$ | $R_3$ |
| | 2.93 pF | 3.62 nH | 92 mΩ |

On account of the underlying periodicity, the microstrip open stubs resonate at every multiple of one-half wavelength, known as the free spectral range (FSR). Therefore, the transmittance response of the circuit model does not match with the transmittance of a single-stub resonator away from the EIT resonance peaks. In the current design, the FSR is calculated to be 2.88 GHz by calculating the frequency at which the open stub becomes half-wavelength, as follows:

$$FSR = \frac{c}{2\sqrt{\varepsilon_r} C_l}, \quad (8)$$

where $C_l$ is the length of the stub. The extracted RLC values for the three open-stub structures provided in Table 1 provide insight into the underlying resonance mechanism. Note the direct correspondence between the single stub resonator and its equivalent RLC model. However, when an identical stub is added, the equivalent lumped parameters of both stubs attain different values due to the proximity coupling of the intensive electric fields causing the detuning effect. In the absence of mutual coupling, the resonator model would constitute identical lumped components, leading to only a single narrowband resonance. Table 2 summarizes the achieved EIT parameters for the single stub, double stub, and triple stub designs. With addition of open microstrip stubs and manipulation of their locations, several EIT bands with decent Q-factors and group indexes can be achieved.

TABLE 2

Summary of Resonance Parameters

| Structure | Resonance Type | Fano Asymmetric Parameter(q) | EIT Quality Factor (Q) | EIT Transmittance Efficiency | Group Index($n_g$) |
|---|---|---|---|---|---|
| Single Stub | Lorentzian | — | — | — | — |
| Double Stub | Single EIT | 0.0533 | 85 | 99% | 300 |
| Triple Stub | Double EIT | 0.0533/−0.061 | 25/147 | 99%/75% | 160/530 |

Figure 3A:
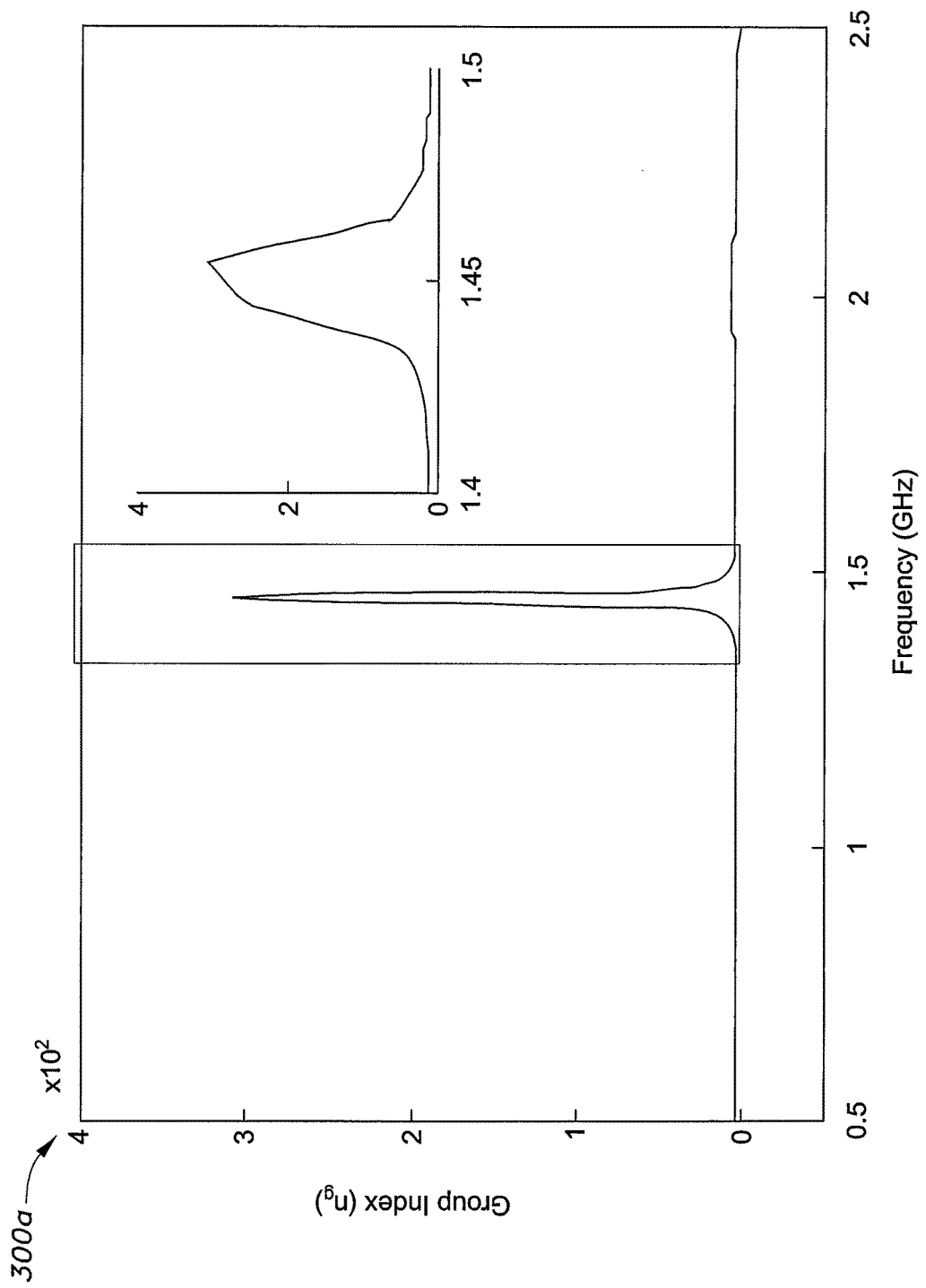
FIG. 3A is a plot showing the group refractive index as a function of frequency for the double open-stub embodiment of FIG. 1A.
Figure 3B:
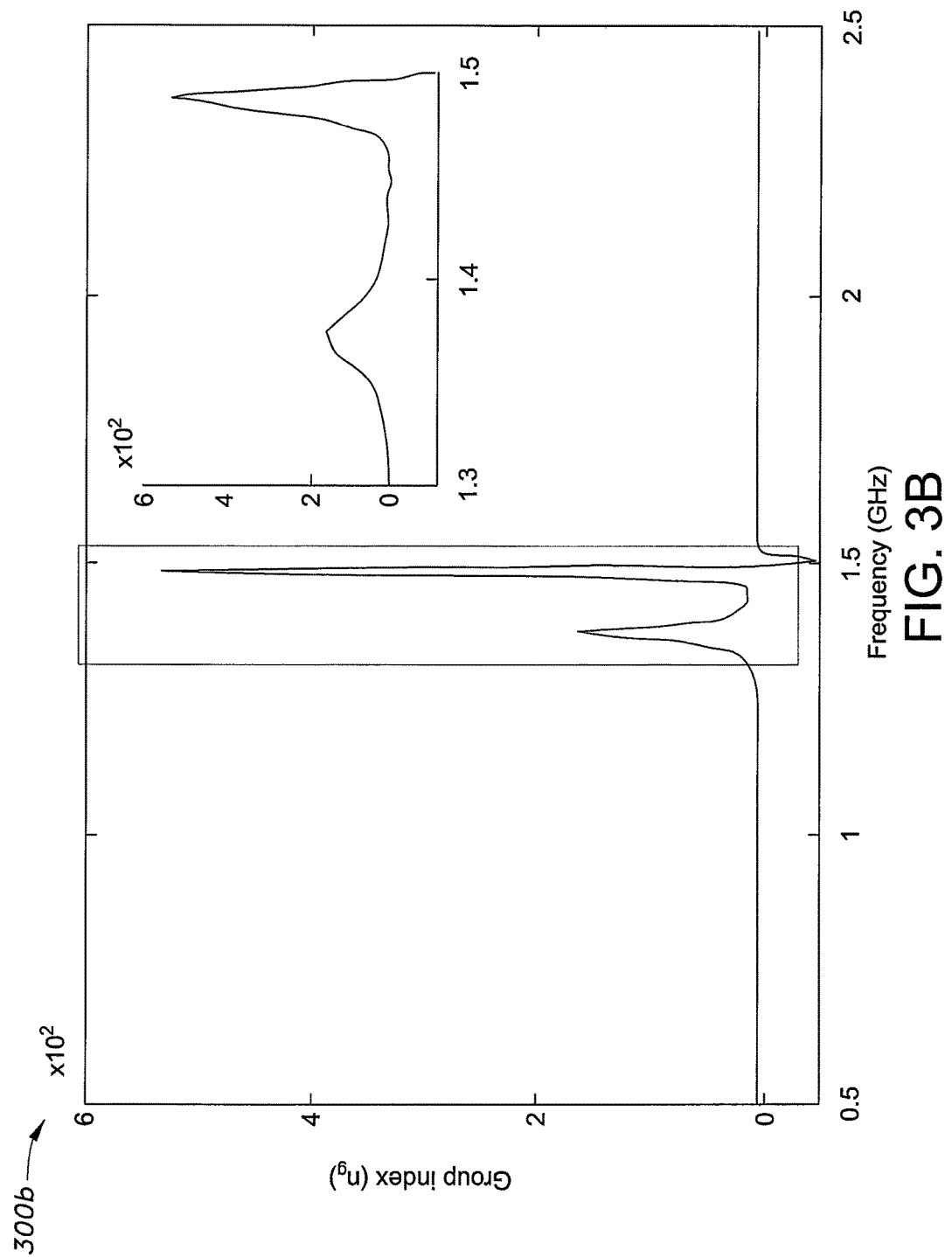
FIG. 3B is a plot showing the group refractive index as a function of frequency for the triple open-stub embodiment of FIG. 1B.

With respect to a microwave buffering application of the present circuits, EIT resonance is associated with sudden and narrowband phase change, which is a desired characteristic for microwave buffers. The 'slowness' of a microwave device is measured in terms of the effective group refractive index ($n_g$), which can be extracted from the transmission phase using the relation:

$$n_g = -\frac{c}{t_l}\frac{\partial \varphi}{\partial \omega}, \quad (9)$$

where, c is the speed of light, $t_l$ is the length of the transmission path, $\omega$ is the frequency and $\varphi$ is the phase of transmission coefficient $S_{21}$. Note that for the single-stub resonator, the slope of the transmission phase is positive in the vicinity of the resonance. Consequently, the group refractive index becomes negative (Eq. 9), which refers to an anomalous pulse propagation with a negative group velocity. More interestingly, the double- and triple-stub resonators have high group refractive index values. For the double stub, the value of $n_g$ exceeds 300 within the transparency window. Particularly, the multiple EIT resonance effect for the triple-stub resonator is the most interesting case, as it leads to multiple bands supporting slow light propagation. Around the first EIT band, the effective group refractive index reaches 160, and for the second EIT band, the group index reaches 530. The group refractive index $n_g$ for the double-stub embodiment 10a is shown in plot 300a of FIG. 3A. The group refractive index $n_g$ for the triple-stub embodiment 10b is shown in plot 300b of FIG. 3B.

Figure 4A:
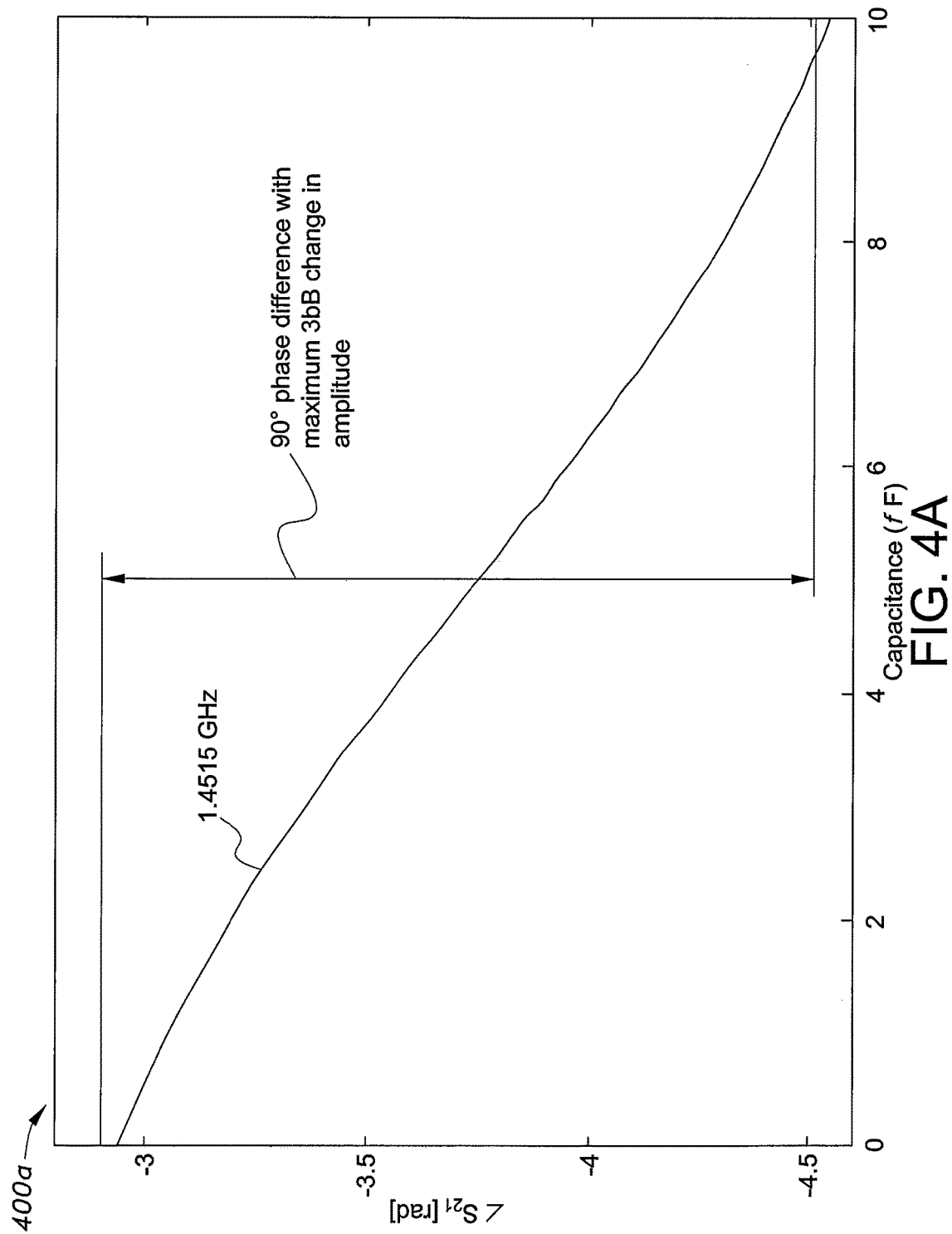
FIG. 4A is a plot showing phase difference as a function of capacitance from 0 fF to 10 fF for a double open stub with coupling capacitor embodiment of a microstrip circuit exhibiting electromagnetically induced transparency and Fano resonance according to the present invention.
Figure 4B:
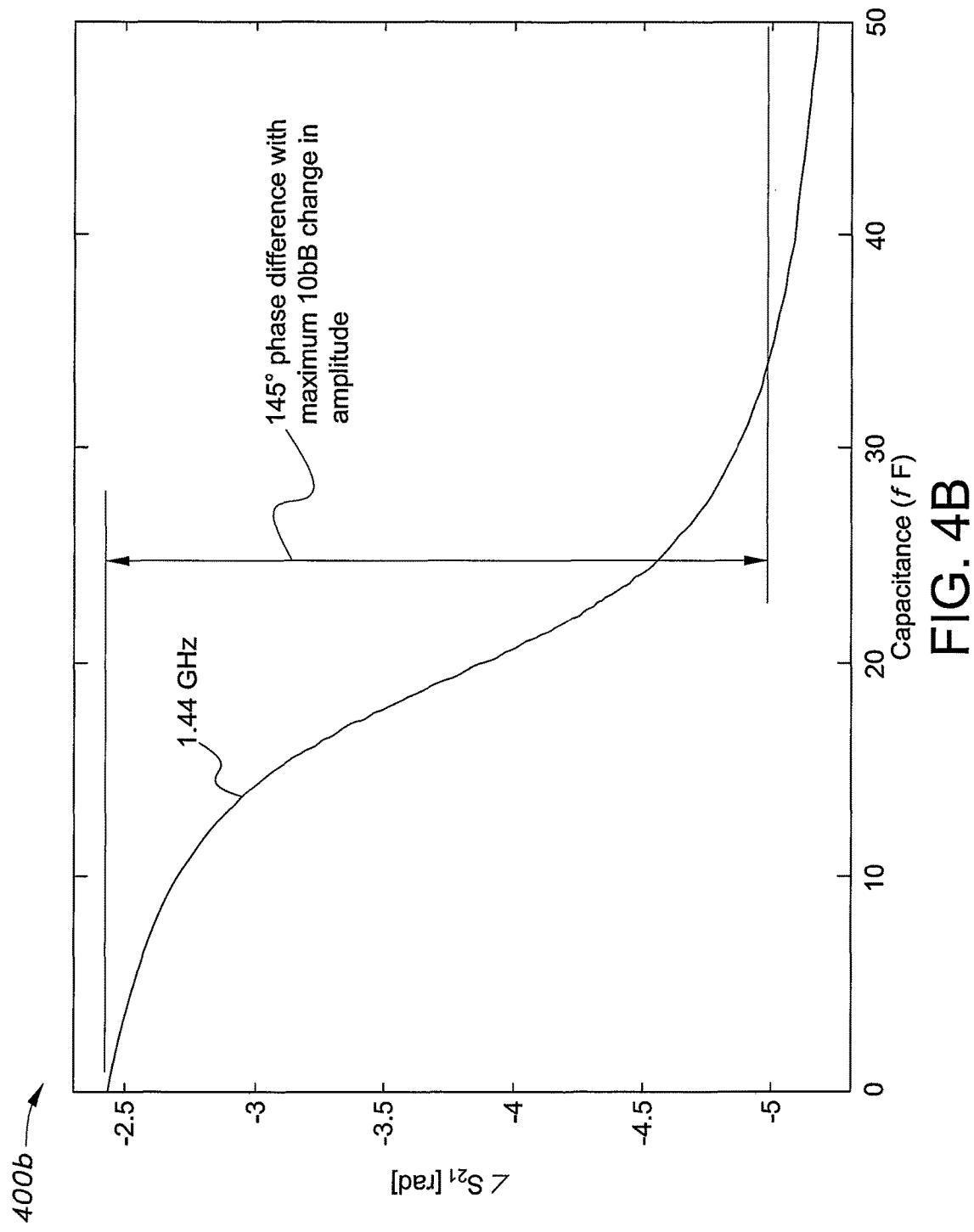
FIG. 4B is a plot showing phase difference as a function of capacitance from 0 to 33 fF for a double open stub with coupling capacitor embodiment of a microstrip circuit exhibiting electromagnetically induced transparency and Fano resonance according to the present invention.

With respect to active transmission phase control, the present circuits can actively control the phase of the transmitted signal. The rapid phase change across the EIT resonance can be exploited for achieving this purpose. In order to demonstrate dynamic phase control of transmitted signals in the present circuits, a small variable capacitive element is introduced between and operably connected to adjacent stubs of the double-stub resonator. The electric field is most intense around ends of the stubs. Therefore, the capacitive element is positioned towards the ends, in between the two stubs. The present active phase control can be realized by means of adding a varactor element between the two open-stubs, e.g., between the ends of stubs 11 and 12. Due to strong field coupling between the stubs, a small capacitance leads to large red shift in the resonance spectrum. As shown in plot 400a of FIG. 4A, a small increase from 0 femtofarads (fF) to 10 fF is enough to red shift the EIT resonance by nearly 10 MHz. The corresponding phase change is approximately 90°. This phase control phenomenon is further demonstrated for a fixed frequency of 1.4515 GHz. The red shift due to increase in capacitance from 0 fF to 10 fF leads to a phase change of 90°. It should be understood that the corresponding change in amplitude is less than 3 dB. To explain the associated resonance phenomenon, the electric field distributions are considered at the frequency of 1.4515 GHz for two different values of capacitance, i.e., 0 fF and 10 fF. The strength of the electric field decreases with the increase in capacitance. Subsequently, as shown in plot 400b of FIG. 4B, the variation of capacitance between 0 F to 33 fF at a fixed frequency of 1.44 GHz leads to a phase change of 145°. The corresponding change in amplitude is less than 10 dB. The electric field distributions at 1.44 GHz are considered for various values of capacitances, i.e., 0 fF, 15 fF, and 33 fF, respectively. The phase variation is evident from the field reversal on the stubs as the capacitance is increased from 0 fF to 33 fF.

It is shown by modeling, simulation, and measurement that multiple electromagnetically induced transparency (EIT) bands and Fano resonances can be achieved in a very simple multi-stub microstrip circuit. The EIT bands are produced due to destructive interference in closely located open circuit stubs. In particular, it is demonstrated that with proper placement of these stubs, near-unity transmission under lossless conditions can be achieved, and group indexes up to 147 and 530, respectively, can be obtained. The main benefit of the open-stub configuration lies in the fact that the resonance mixing takes place at the open ends of the stubs, away from the transmission line. Hence, varactor diodes can be conveniently placed without breaking the transmission path for low loss phase-control of EIT applications. A 90° transmission phase shift is achieved with a 0 fF to 10 fF capacitance change between the two open stubs of the resonator. The EIT dispersive properties can be further utilized for developing electromagnetic slow-wave interconnects and sensing applications.

It is to be understood that the present invention is not limited to the embodiments described above, but encompasses any and all embodiments within the scope of the following claims.

We claim:

1. A microstrip circuit exhibiting electromagnetically induced transparency and Fano resonance, comprising:
    a non-conducting substrate having a top surface and a bottom surface;
    a rectangular conductive transmission line strip disposed on the top surface of the non-conducting substrate;
    two substantially identical rectangular conductive stubs disposed on the top surface of the non-conducting substrate in parallel relation to each other and in perpendicular relation to the conducting transmission strip, the stubs being electrically connected to and extending from the transmission line strip, the stubs having open ends distal from the conductive transmission line strip, the two stubs being mutually coupled to form a Fano resonator defining bands of electromagnetically induced transparency (EIT); and
    a ground plane disposed on a bottom surface of the non-conducting substrate.

2. The microstrip circuit according to claim 1, wherein the two stubs have a length corresponding to one-quarter wavelength of a resonant frequency of the Fano resonator.

3. The microstrip circuit according to claim 2, wherein each said stub has a length $C_l$ of approximately 35 mm.

4. The microstrip circuit according to claim 3, wherein the stubs are separated from each other by a distance d of approximately 2 mm.

5. The microstrip circuit according to claim 4, wherein the transmission line strip has a total length, $t_l$ of approximately 20 mm.

6. The microstrip circuit according to claim 4, wherein each of the stubs has a width $C_w$, of approximately 2 mm.

7. The microstrip circuit according to claim 4, wherein the transmission line strip has a width $t_w$, of approximately 3.16 mm.

8. The microstrip circuit according to claim 2, further comprising a capacitance disposed proximate the open ends of the stubs and electrically connected to the open ends of the stubs.

9. The microstrip circuit according to claim 8, wherein the capacitance comprises a varactor diode having a variable capacitance for red-shifting the electromagnetically induced transparency of the Fano resonator.

10. The microstrip circuit according to claim 9, wherein the varactor diode has a capacitance between 0 fF and 10 fF, thereby producing a phase change of approximately 90° at 1.45 GHz frequency, and a corresponding change in amplitude less than 3 dB.

11. The microstrip circuit according to claim 9, wherein the varactor diode has a capacitance between 0 fF and 33 fF, thereby producing a phase change of approximately 145° at 1.44 GHz frequency, and a corresponding change in amplitude less than 10 dB.

12. The microstrip circuit according to claim 1, wherein the substrate has a permittivity of approximately 2.94.

13. The microstrip circuit according to claim 1, wherein the substrate has a thickness of approximately 0.76 mm.

14. The microstrip circuit according to claim 1, wherein the circuit has a high effective group refractive index ($n_g$) characterized by:

$$n_g = -\frac{c}{t_l}\frac{\partial \varphi}{\partial \omega},$$

where c is the speed of light, $t_l$ is the length of the transmission path, w is the frequency, and $\varphi$ is the phase of the transmission coefficient $S_{21}$.

15. The microstrip circuit according to claim 14, wherein the value of group index ($n_g$) exceeds 300 within a transparency window and a corresponding Q-factor is approximately 85.

16. The microstrip circuit according to claim 1, further comprising a third stub, the third stub being a rectangular conductive stub substantially identical to the two stubs and disposed on the top surface of the non-conducting substrate in parallel relation to the two stubs and in perpendicular relation to the conducting transmission strip, the three stubs being electrically connected to and extending from the transmission line strip, the three stubs having open ends distal from the conductive transmission line strip, the third stub having a length corresponding to one-quarter wavelength of a resonant frequency of the Fano resonator, the three stubs being mutually coupled so that the Fano resonance defines first and second distinct bands of electromagnetically induced transparency (EIT).

17. The microstrip circuit according to claim 16, wherein the first and second EIT bands have an effective group refractive index of 160 and 530, respectively.

18. The microstrip circuit according to claim 17, wherein the first and second EIT bands have a corresponding Q-factor of about 25 and 147, respectively.

* * * * *